(12) United States Patent
Sikora et al.

(10) Patent No.: US 6,784,000 B2
(45) Date of Patent: Aug. 31, 2004

(54) METHOD FOR MEASUREMENT OF ELECTROMIGRATION IN SEMICONDUCTOR INTEGRATED CIRCUITS

(75) Inventors: Robert Sikora, San Jose, CA (US); Gedaliahoo Kreiger, Rehovot (IL); Yongbum Cuevas, Los Gatos, CA (US)

(73) Assignee: QualiTau, Inc., Santa Clara, CA (US)

( * ) Notice: Subject to any disclaimer, the term of this patent is extended or adjusted under 35 U.S.C. 154(b) by 214 days.

(21) Appl. No.: 09/920,086

(22) Filed: Jul. 31, 2001

(65) Prior Publication Data

US 2002/0022282 A1 Feb. 21, 2002

Related U.S. Application Data

(62) Division of application No. 09/383,593, filed on Aug. 26, 1999, now abandoned.

(51) Int. Cl.$^7$ .............................................. H01L 21/00
(52) U.S. Cl. ............................. 438/11; 438/14; 438/18; 438/17; 438/468
(58) Field of Search .............................. 438/11, 14, 18, 438/17, 468; 324/522, 523, 719, 765, 715; 257/48, 776, 773

(56) References Cited

U.S. PATENT DOCUMENTS

| | | | |
|---|---|---|---|
| 5,291,142 A | * | 3/1994 | Ohmi .......................... 324/719 |
| 5,497,076 A | * | 3/1996 | Kuo et al. ................ 324/158.1 |
| 5,801,394 A | * | 9/1998 | Isobe ........................... 257/48 |
| 6,147,361 A | * | 11/2000 | Lin et al. ...................... 257/48 |

* cited by examiner

*Primary Examiner*—Olik Chaudhuri
*Assistant Examiner*—Hsien-Ming Lee
(74) *Attorney, Agent, or Firm*—Beyer Weaver & Thomas, LLP

(57) ABSTRACT

Electromigration testing is accelerated in the batch fabrication of semiconductor integrated circuits by forming test structures during the metal deposition phase of the batch fabrication process. Test metal lines can be formed on steps etched in a silicon oxide insulating layer with the vertical walls of the steps being greater than twice the thickness of the deposited metal whereby metal is not deposited on the side walls. Alternatively, test lines in the deposit metal layer can be formed by laser ablation or by ultrasound erosion. In another embodiment, electromigration tests are performed directly on the deposit metal layer through use of spaced elongated electrical contacts placed on the deposited metal layer surface. The elongated contacts can be wires of known diameter and length, or the elongated contacts can comprise a plurality of point contacts.

3 Claims, 6 Drawing Sheets

Cross Sectional Area (A) = Width x Thickness
Current Density (J) = Current (I) / Cross Sectional Area (A)

METHOD FOR MEASUREMENT OF ELECTROMIGRATION IN SEMICONDUCTOR INTEGRATED CIRCUITS

This application is division of U.S. application Ser. No. 09/383,593, filed on Aug. 26, 1999, now abandoned.

BACKGROUND OF THE INVENTION

This invention relates generally to semiconductor integrated circuit fabrication, and more particularly the invention relates to measurement of electromigration of metal atoms in metal interconnect lines in integrated circuits.

Electromigration is the migration or movement of metal atoms within a conductor in response to an electrical current or electron wind within the conductor. The migration of the metal atoms is dependent on several factors but the dominant factors for a given material are current density and temperature. A consequence of this metal migration is the formation of areas from which the metal has migrated and consequently left voids which contain no metal. A related consequence of this metal migration is the formation of areas to which the metal has migrated and built up in an excess quantity which are often referred to as hillocks or extrusions.

Given the proper conditions, electromigration can occur in a metal wire eventually resulting in the formation of a void which grows until it completely spans the diameter of the wire resulting in an open circuit. The time it takes the material under stress to fail is termed the "time to failure". The equation relating time to failure to both current density and temperature is well known and is commonly referred to as Black's Equation., as follows:

$$MTF = AJ^{-n} \exp(E_a/kT)$$

where

MTF=mean time to failure
A=proportionality constant
J=current density
n=current exponent
Ea=activation energy
T=temperature
k=boltzmans constant The "time to failure" is of great interest in the integrated circuit industry because electromigration failures can be the main cause of product failures in the field. The only method available to measure electromigration lifetime until now has been to force a known current through a metal line of a given cross sectional area and at a given temperature until failure. The current density through the metal line is calculated by dividing the current by the cross sectional area of the metal conductor 8 as shown in FIG. 1.

Failure is usually defined as a specific change in the resistance of the metal line. This change in resistance can be very slight or in the extreme it can be an open circuit. The only way to know the current density is to know both the current and the cross sectional area of the metal conductor. The current is forced by the user so this is known. The metal test structure is designed by the user so in theory the width of the test structure is known. And the metal is deposited by the user so again in theory the metal thickness is known.

Normal lifetime goals for metal lines in integrated circuits is on the order of 10 years. Therefore, to obtain failures in a reasonable amount of time in the lab, these failures are accelerated on these specific test structures by using higher than normal current densities and higher than normal temperatures. By selecting several accelerated current densities and several accelerated temperatures the failure rates can be extrapolated back to normal use conditions. This prediction of lifetime in the field is the ultimate goal of this reliability test.

The process which is used today to both generate these test structures and then test them is long and arduous. A serious consequence of the length of time it takes to complete the construction of the test structure and then the length of time it takes to test the test structure is the large time constant which results in the feedback of this information to the process to control the parameters which influence the elecromigration behavior. The prior art requires the use of a very specific test structure which must be created in the thin film long after the thin film has been deposited. It can easily take months to obtain the information to feedback to the process. In this time, several millions of dollars worth of semiconductor wafers will have been processed which are potentially at risk of being out of specification and therefore unreliable in the field. The goal of in line electromigration testing is to shorten this time and reduce the amount of material in process which is at risk.

SUMMARY OF THE INVENTION

In accordance with the invention, a test wafer is provided during metal deposition in the batch fabrication of integrated circuit wafers by providing one wafer having an insulating layer with a step pattern etched therein with the step height being greater than twice the thickness of the deposited metal. The cross section allows metal deposition on the top of the step, which is used for electromigration test, but no metal is deposited on the vertical side walls of the step, the vertical side walls having a height of at least twice the metal thickness. The resulting test structure can have a conventional electromigration test performed as soon as, the test wafer emerges from the metal deposition system.

In an alternative embodiment, a test wafer is provided having an insulating layer on which is deposited a metal layer during the metal deposition step in the batch fabrication of integrated circuits. The test wafer is then exposed to a focused laser beam which selectively ablates metal to form a test conductor for electromigration testing. Alternatively, an ultrasonic probe can be used rather than the laser in forming the test conductor by selective erosion of the metal.

In another embodiment of the invention, a test wafer is again provided with an insulating layer on which is deposited a metal layer during the metal deposition step, but the metal layer is not processed further. The metal layer is then contacted by two opposing elongated contacts to which voltages are impressed for the electromigration testing. Metal will remain under the elongated contacts, but near the voltage source contact will be an elongated region where metal has been moved due to electromigration. The elongated contacts can be wires or a plurality of point sources to create a pseudo line source.

The invention and objects and features thereof will be more readily apparent from the detailed description and appended claims when taken with the drawings.

DETAILED DESCRIPTION OF ILLUSTRATIVE EMBODIMENTS

Figure 1:
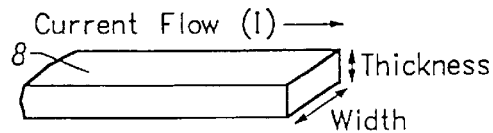
FIG. 1 is a perspective view of a metal conductor illustrating factors used in determining mean time to failure (MTF).
Figure 2:
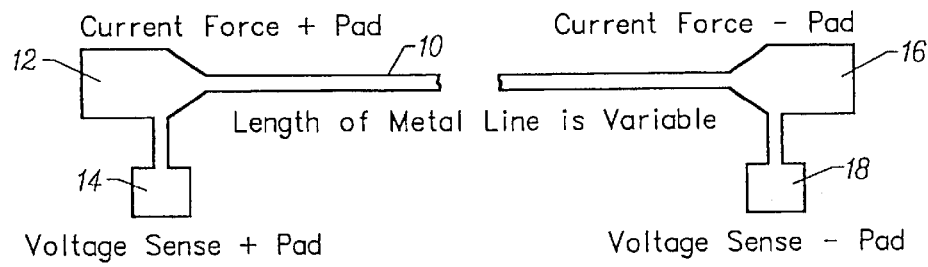
FIG. 2 is a plan view of a typical metal electromigration structure.

Referring now to the drawings, FIG. 2 is a plan view of a typical metal electromigration test structure. The structure includes an elongated metal line 10 which is formed by metal deposition during the batch fabrication of semiconductor integrated circuits and then selectively etched to define the length and width of the metal line. At either end of metal line 10 are pads including a voltage pad 12 and voltage sense pad 14 at one end and a voltage pad 16 and voltage sense pad 18 at the opposing end. As described above, a voltage is impressed across voltage contacts 12, 16 and current flows through the metal line 10. The metal line can be heated to accelerate the electromigration test. After a period of time the metal line is inspected for evidence of metal atom migration which causes a thinning or void in the metal line.

Figure 3:
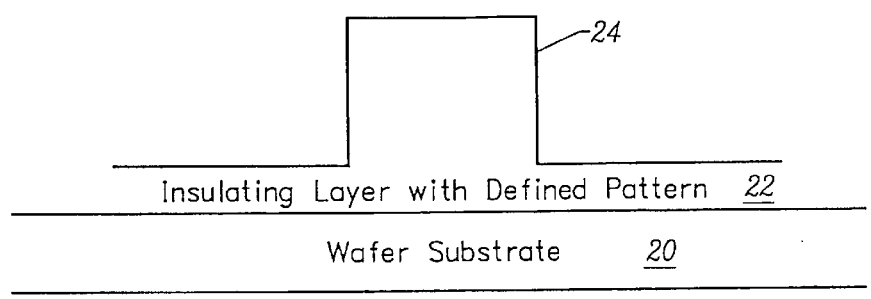
FIGS. 3 and 4 are a section view of a patterned insulating layer before and after metal deposition in fabricating a test wafer in accordance with one embodiment of the invention.
Figure 4:
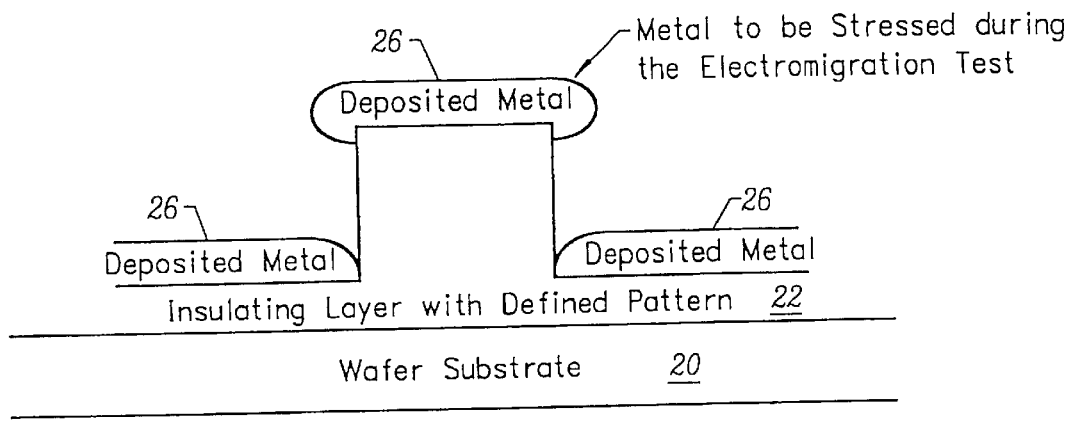

Rather than using the conventional metal deposition and selective etching in forming the test structure of FIG. 2, as in the prior art, a test structure can be formed directly during the metal deposition step. FIGS. 3 and 4 are cross sections of test structure before metal deposition and after metal deposition, respectively. In FIG. 3 semiconductor wafer 20 has a layer of silicon oxide 22 formed thereon either by deposition or by thermal oxidation of the wafer surface. The oxide layer thickness is greater than twice the thickness of a metal to be deposited thereon and preferably more than four times the thickness of the metal thin film to be deposited. Layer 22 is then patterned using conventional techniques such as photolithography and plasma etching to form a step shown generally at 24, the side walls of step 24 being greater than twice the thickness of a metal layer to be deposited.

The test wafer is then processed through the metal deposition system where a thin metal film 26 is deposited as shown in FIG. 4. Since evaporators and sputtering systems are line of sight deposition systems, metal films have difficulty in forming on vertical walls that are greater than two times the deposited thin film thickness. Thus, by creating a structure with walls that are much greater than twice the metal thickness, the deposited metal thin film will not extend from the top of the step to the bottom. Accordingly, a test wafer with a conventional elecromigration test structure is formed during the thin metal film deposition process and requires no further processing. The resulting structure is now ready to have a conventional electromigration test performed as soon as the test wafer emerges from the metal deposition system. The deposited metal at the top of the step is tested and is electrically insulated from the surrounding metal due to the break in the metal on the side wall of the thick insulating structure.

Figure 5A:
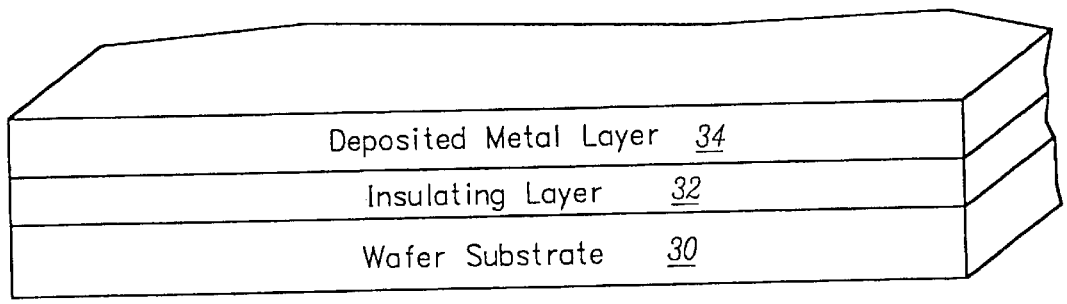
FIGS. 5A and 5B are perspective views illustrating steps in fabricating a metal electromigration structure in accordance with one embodiment of the invention.
Figure 5B:
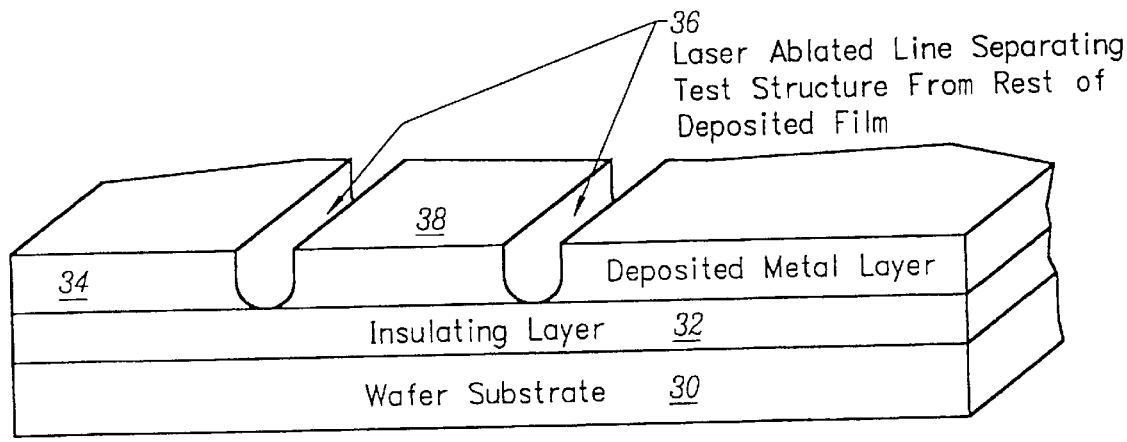

FIGS. 5A and 5B are perspective views showing an alternative method in forming a test structure in accordance with the invention. In the view of FIG. 5A, the wafer substrate 30 again has an insulating layer 32 such as silicon oxide formed thereon with the deposited metal layer such as aluminum 34 formed on the insulating layer. In FIG. 5B grooves 36 are formed through metal layer 34 to the insulating layer 32 by means of laser ablation. Lasers have small beam size and precise positioning capabilities, thus the grooves 36 can be narrow regions which precisely control the dimensions of the resulting metal line. Alternatively, an ultrasonic probe can be employed in place of the laser to directly erode metal from the narrow regions 36 to define the test structure 38.

Figure 10A:
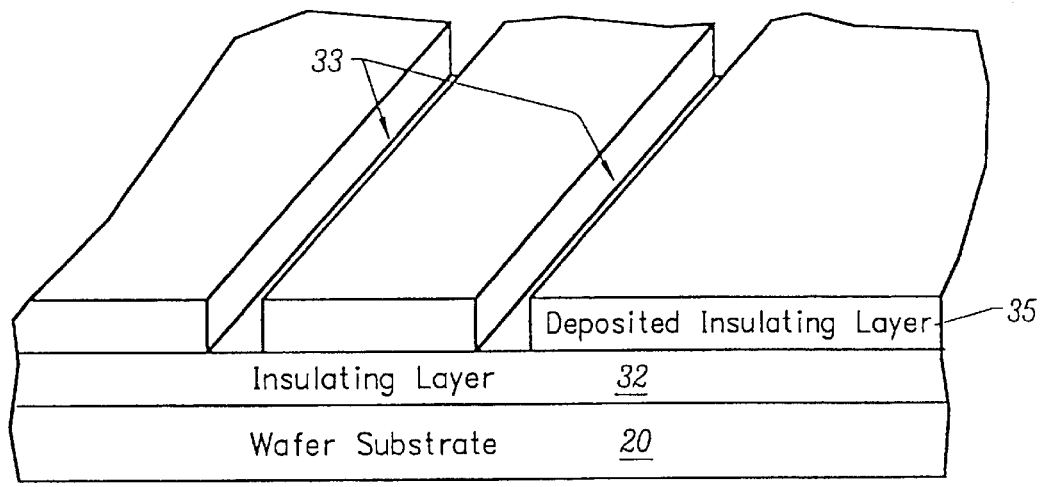
FIGS. 10A and 10B are perspective views illustrating steps in fabricating a metal migration structure in accordance with another embodiment of the invention.
Figure 10B:
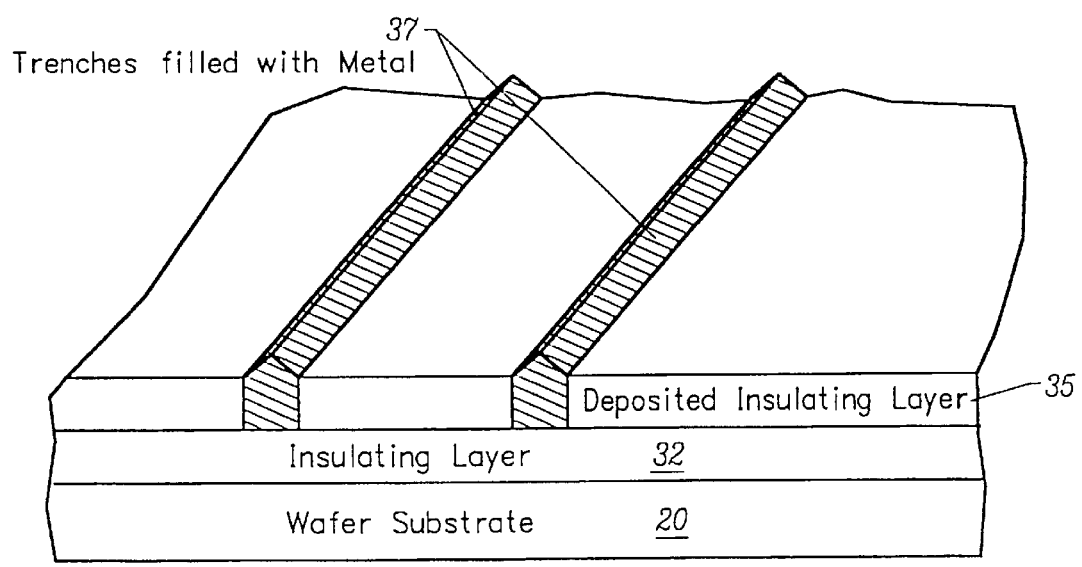

FIGS. 10A and 10B are perspective views illustrating another alternative method in forming a test structure in accordance with the invention using a Damascene or dual Damascene process. In FIG. 10A the wafer 30 again has an insulating layer 32 such as silicon oxide formed thereon with a second insulating layer 35 of oxide or nitride deposited thereon. Trenches 33 are etched in the surface of insulating layer 35, and then a metal layer of aluminum for example is deposited over the surface of layer 35 and filling trenches 33. The metal layer is then removed by chemical etching and mechanical polishing leaving the metal lines 37 in trenches 33 with the insulated lines functioning as the test structure configured as in FIG. 2.

Figure 6A:
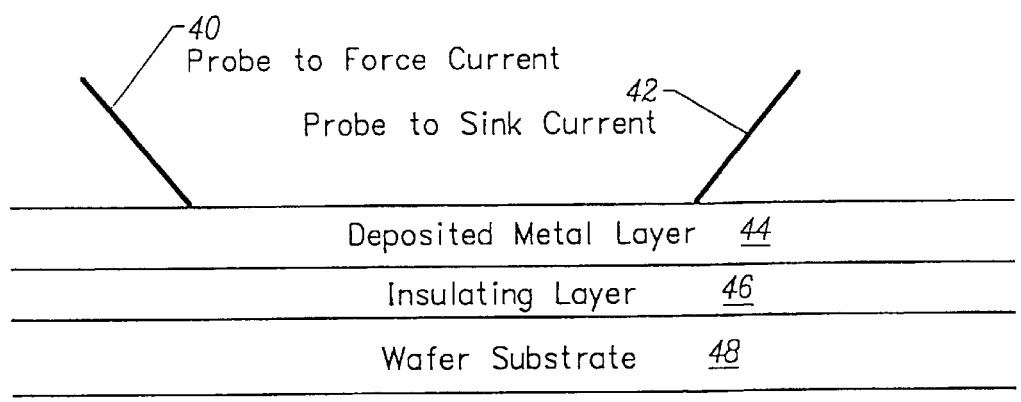
FIGS. 6A, 6B illustrate a prior art test procedure in making spreading resistance measurements.
Figure 6B:
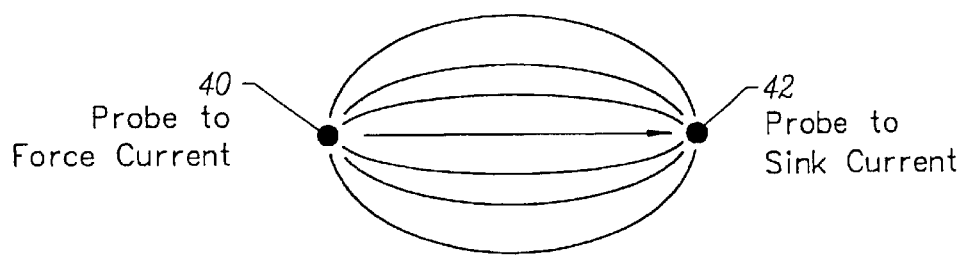
Figure 7:
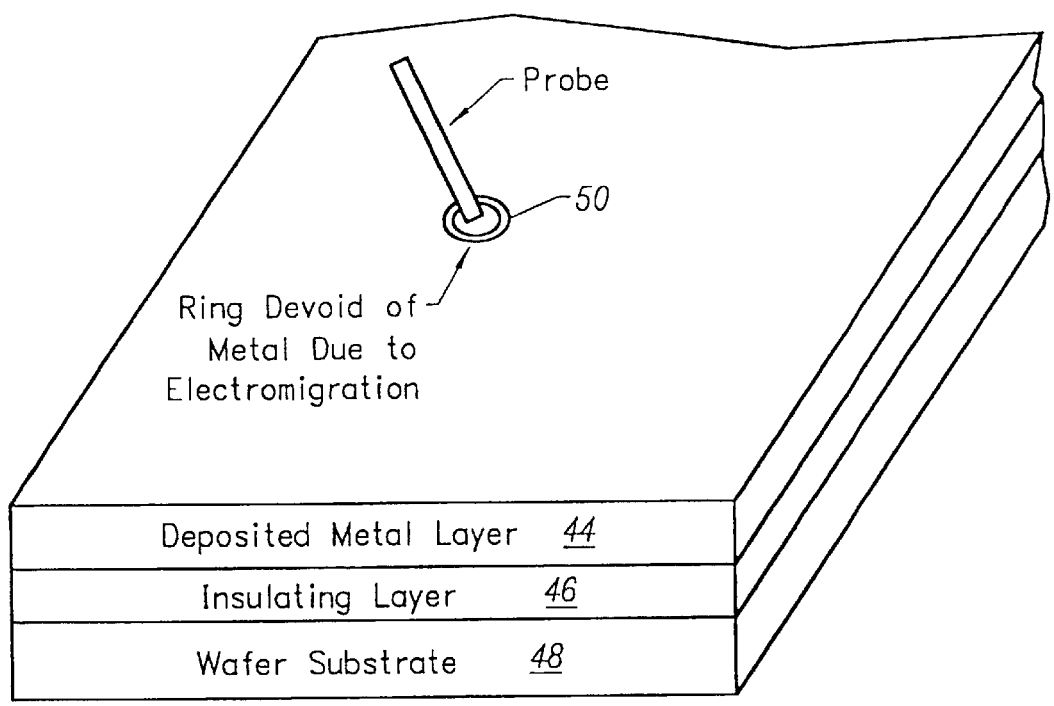
FIG. 7 illustrates the use of a test procedure of FIG. 6 for electromigration test.

The embodiments of the invention described above are directed to forming test structures during the batch fabrication of integrated circuits with the test structure then subjected to conventional electromigration testing. In accordance with another embodiment of the invention electromigration testing is implemented with the deposited metal layer without further definition of a test structure such as described above. FIG. 6A is a section view illustrating a prior art test procedure for measuring spreading resistance in which two probes 40, 42 engage a deposited metal layer 44 formed on insulating layer 46 on wafer substrate 48. FIG. 6B illustrates the flow of current from probe 40 to probe 42 with most of the current flowing through a direct path between the probes and with other current paths also flowing as illustrated. This method is commonly used to make thin film measurements such as spreading resistance. However, spreading resistance measurements use orders of magnitude less current than an electromigration test. In this configuration the highest current density is at the point source which is the probe contact to the thin metal film. Therefore, this is where the electromigration would first occur. In an electromigration test using this test configuration, the result is the formation of a dot of metal left under the probe and a ring 50 just outside the probe contact where the metal has been removed due to electromigration, as illustrated in FIG. 7. An additional problem with this procedure is that the probe contact area is not known accurately. This is due to changes in the shape of the probe tip from probe to probe as well as changes in probe area due to changes in contact force applied to the probe on any given incident of probing. These subtle changes in contact area result in large changes in the current density at the probe contact area. Therefore, this is not a reproducible method of applying the stress current for an electromigration test.

Figure 8A:
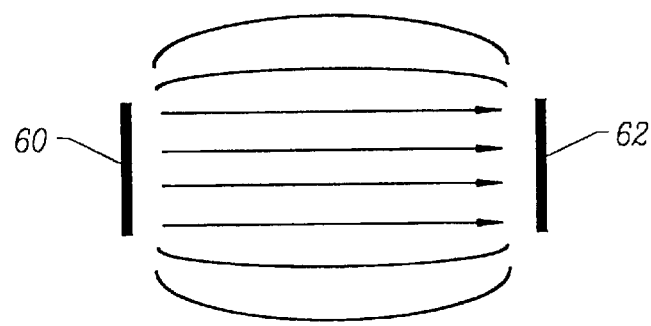
FIGS. 8A, 8B illustrate use of a line source in electromigration tests in accordance with another embodiment of the invention.
Figure 8B:
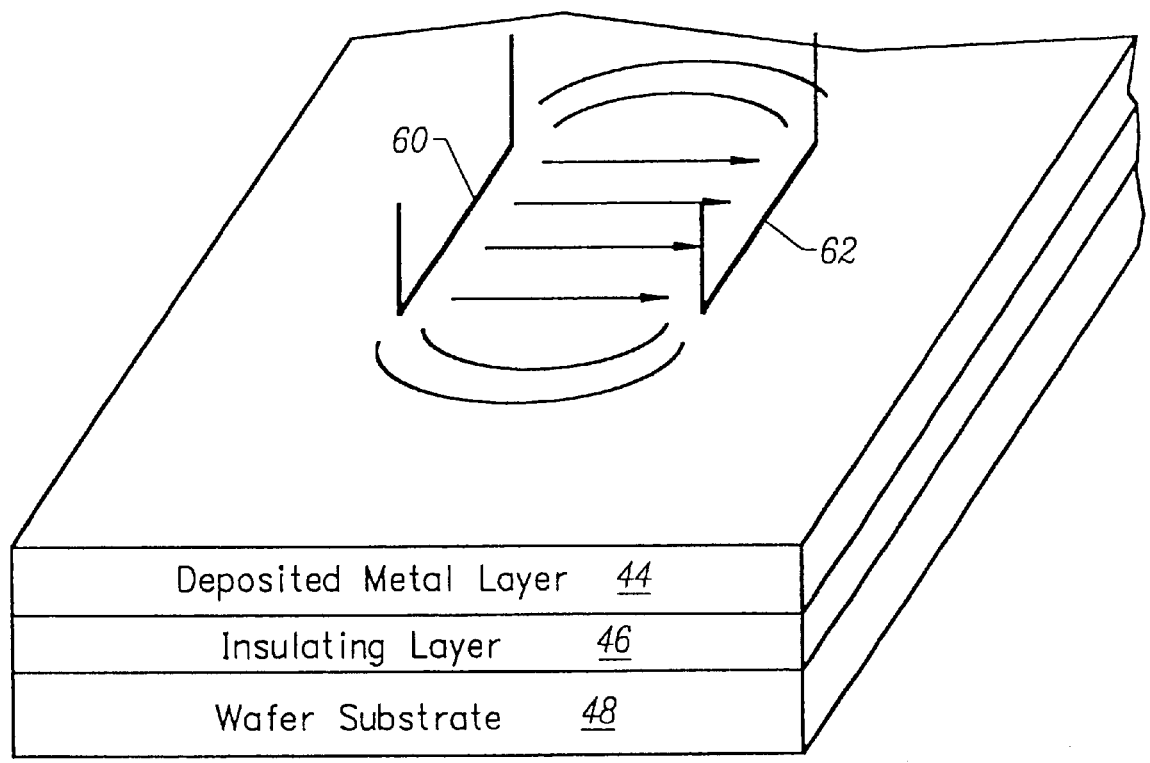

FIGS. 8A, and 8B are a top view and perspective view of an improved method of applying a known current density through use of elongated wire contacts 60 and 62 in accordance with another embodiment of the invention. The wires 60, 62 having known radius and in length are placed in contact with the thin metal film 44. This results in the current being supplied over a larger contact area which results in a uniform current density between the line sources except at the ends where fringing occurs as illustrated in FIG. 8B.

Figure 9:
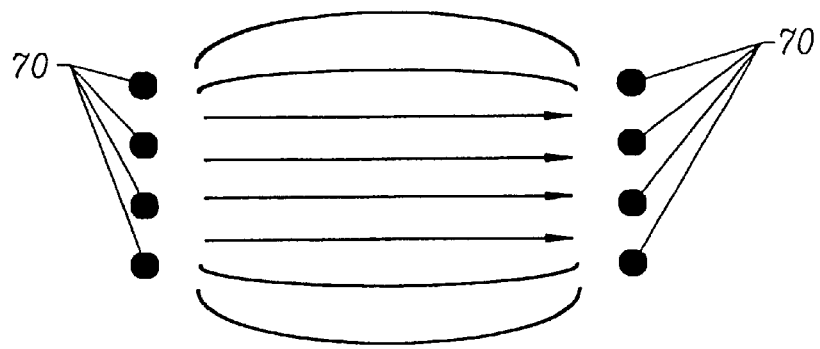
FIG. 9 illustrates an elongated electrical contact comprising a plurality of aligned point contacts in accordance with another embodiment of the invention.

Alternatively, as shown in FIG. 9, the wire contacts can be replaced by a plurality of point contact sources 70 which are linearly arranged to form a pseudo line source. Advantageously, a uniform current density is created between the row of probes using conventional probe technology. The resulting current density is the superimposition of the current density from each individual source. As noted above, temperature is often used to accelerate electromigration failures. It is also possible to control where electromigration occurs by controlling temperatures. In the embodiment of FIG. 9, the thin metal film between probe contacts 70 is heated but not at the probes. Thus, electromigration phenomena can be accelerated in the heated region even though the current density is uniform.

The fabrication of test structures and test procedures in accordance with the invention accelerate electromigration testing and reduce the number of batch fabricated semiconductor wafers which are potentially at risk of being out of specification and therefore unreliable in the field. While the invention has been described with specific structures and methods, the description is illustrative of the invention and is not to be construed as limiting the invention. Various modifications and applications may occur to those skilled in the art without departing from the true spirit and scope of the invention as defined by the appended claims.

What is claimed is:

1. A method of testing for electromigration in a metal layer on a semiconductor substrate comprising the steps of
   a) providing a semiconductor wafer having a metal layer overlying an insulating layer on a surface of the substrate,
   b) applying two spaced elongated electrical wire contacts in longitudinal pressure engagement with the metal layer,
   c) applying a voltage potential across the two elongated wire contacts thereby causing electromigration of metal atoms away from at least one electrical wire contact, and
   d) inspecting the surface adjacent to said at least one elongated wire contact for metal migration.

2. The method as defined by claim 1 wherein in step b) each elongated electrical wire contact comprises a wire of known radius and length.

3. A method of testing for electromigration in a metal layer on a semiconductor substrate comprising the steps of
   a) providing a semiconductor wafer having a metal layer overlying an insulating layer on a surface of the substrate,
   b) applying two spaced elongated electrical contacts in pressure engagement with the metal layer, at least one elongated electrical contact comprising a plurality of aligned point contacts,
   c) applying a voltage potential across the two elongated contacts thereby causing electromigration of metal away from at least one electrical contact, and
   d) inspecting the surface adjacent to said at least one elongated contact for metal migration.

* * * * *